US008996950B2

(12) United States Patent
Desireddi

(10) Patent No.: US 8,996,950 B2
(45) Date of Patent: Mar. 31, 2015

(54) ERASURE CORRECTION USING SINGLE ERROR DETECTION PARITY

(75) Inventor: Sateesh Desireddi, Andhra Pradesh (IN)

(73) Assignee: Sandisk Technologies Inc., Plano, TX (US)

( * ) Notice: Subject to any disclaimer, the term of this patent is extended or adjusted under 35 U.S.C. 154(b) by 358 days.

(21) Appl. No.: 13/426,980

(22) Filed: Mar. 22, 2012

(65) Prior Publication Data

US 2013/0227374 A1    Aug. 29, 2013

(30) Foreign Application Priority Data

Feb. 23, 2012   (IN) .............................. 688/CHE/2012

(51) Int. Cl.
| | |
|---|---|
| H03M 13/00 | (2006.01) |
| H03M 13/15 | (2006.01) |
| H03M 13/11 | (2006.01) |
| H03M 13/45 | (2006.01) |
| H03M 13/37 | (2006.01) |
| G06F 11/10 | (2006.01) |

(Continued)

(52) U.S. Cl.
CPC ........ *H03M 13/154* (2013.01); *H03M 13/1191* (2013.01); *H03M 13/455* (2013.01); *H03M 13/373* (2013.01); *H03M 13/1515* (2013.01); *G06F 11/1048* (2013.01); *G06F 3/0619* (2013.01); *G06F 12/0246* (2013.01)
USPC ............................. 714/758; 714/780; 714/784

(58) Field of Classification Search
CPC ............ G06F 11/1012; G06F 11/1072; G06F 11/1024; H03M 13/154; H03M 13/455; H03M 13/373; H03M 13/1191; H03M 13/1515

USPC ........................................ 714/758, 780, 784
See application file for complete search history.

(56) References Cited

U.S. PATENT DOCUMENTS

| | | | |
|---|---|---|---|
| 6,654,926 B1 | 11/2003 | Raphaeli et al. | |
| 6,675,349 B1 * | 1/2004 | Chen | ............................. 714/804 |
| 7,447,948 B2 * | 11/2008 | Galbi et al. | .................... 714/701 |

(Continued)

FOREIGN PATENT DOCUMENTS

| | | |
|---|---|---|
| WO | 2009028281 A1 | 3/2009 |
| WO | 2009041153 A1 | 4/2009 |
| WO | 2009107267 A1 | 9/2009 |

OTHER PUBLICATIONS

The International Search Report and Written Opinion of the International Searching Authority mailed Aug. 9, 2013 in International Application No. PCT/US2013/023554, 9 pages.

*Primary Examiner* — James C Kerveros
(74) *Attorney, Agent, or Firm* — Toler Law Group, PC

(57) ABSTRACT

A method includes receiving a representation of a set of single error detection (SED) parity bits and a representation of data. The data includes an error correction coding (ECC) codeword including information bits and ECC parity bits. Each SED parity bit of the set of SED parity bits indicates a parity value for a corresponding portion of the data. The method includes, in response to determining that a particular portion of the representation of the data includes a single erasure bit, selectively modifying a bit value of the single erasure bit based on the representation of the SED parity bit that corresponds to the particular portion and generating an updated representation of the ECC codeword when the bit value of the single erasure bit corresponds to the ECC codeword and has been modified. The method may include initiating an ECC decode operation of the updated representation of the ECC codeword.

27 Claims, 5 Drawing Sheets

(51) Int. Cl.
  *G06F 3/06* (2006.01)
  *G06F 12/02* (2006.01)

(56) References Cited

U.S. PATENT DOCUMENTS

| 7,587,657 | B2 * | 9/2009  | Haratsch ............... 714/780 |
| 7,793,196 | B2 * | 9/2010  | Jiang et al. ............ 714/784 |
| 7,904,783 | B2   | 3/2011  | Brandman et al. |
| 7,962,837 | B2 * | 6/2011  | Jones, Jr. .............. 714/781 |
| 7,971,125 | B2 * | 6/2011  | Graef et al. ........... 714/769 |
| 8,069,394 | B2 * | 11/2011 | Kanno et al. .......... 714/758 |
| 8,413,023 | B2 * | 4/2013  | Ashe et al. ............ 714/781 |
| 8,418,026 | B2 * | 4/2013  | D'Abreu et al. ....... 714/758 |
| 8,527,819 | B2 * | 9/2013  | Shalvi et al. .......... 714/710 |
| 8,589,756 | B2 * | 11/2013 | Ishikawa et al. ....... 714/758 |

* cited by examiner

ERASURE CORRECTION USING SINGLE ERROR DETECTION PARITY

CLAIM OF PRIORITY

The present application claims priority from Indian Patent Application No. 688/CHE/2012 filed on Feb. 23, 2012, which is incorporated herein in its entirety.

FIELD OF THE DISCLOSURE

The present disclosure is generally related to erasure correction in data.

BACKGROUND

Non-volatile data storage devices, such as universal serial bus (USB) flash memory devices or removable storage cards, have allowed for increased portability of data and software applications. Flash memory devices can enhance data storage density by storing multiple bits in each flash memory cell. For example, Multi-Level Cell (MLC) flash memory devices provide increased storage density by storing 3 bits per cell, 4 bits per cell, or more. Although increasing the number of bits per cell and reducing device feature dimensions may increase a storage density of a memory device, a bit error rate of data stored at the memory device may also increase.

One of the reasons for bit errors in MLC devices is merging of threshold voltage distribution profiles of different programmable states of MLC cells. Merging of threshold voltage distribution profiles of different states can be due to effects such as cycling (e.g. a number of write/erase cycles) or effects such as "data retention" (e.g. a loss of charge of a floating gate of a transistor of a flash memory cell over time that results in a reduction in the cell's threshold voltage). Some of these bit errors can be converted to erasures by performing a "soft" read of MLC cells according to an offset voltage $\Delta V_r$. To illustrate, a "hard" read may determine a hard bit value of a cell based on whether the cell has a threshold voltage above or below a read voltage $V_1$. A "soft" read may be performed at a read voltage $V_1+\Delta V_r$ and/or at a read voltage $V_1-\Delta V_r$ to obtain one or more soft bit values.

If a hard bit value read from a cell differs from a soft bit value read from the cell, a threshold voltage of the cell is near a boundary between cell states. The hard bit value read from the cell may therefore be considered less reliable (as compared to a hard bit value read from a cell having a threshold voltage in a center of a cell state), resulting in an "erasure," also referred to as a soft bit error. Erasures may result from cells that exhibit hard bit errors because the cells have drifted from an initial state to a neighboring state (Error/Erasure). However, erasures may also result from cells that have approached, but have not crossed, a state boundary and that do not exhibit hard bit errors (Erasure/No-Error).

SUMMARY

Erasure correction of data including a possibly corrupted ECC codeword may be performed prior to ECC decoding by using single error detection (SED) parity bits and soft read information. If a portion of the data includes a single erasure bit and also fails a parity check using a SED parity bit, a bit value of the erasure bit is changed. A resulting updated ECC codeword may be provided to an ECC decoder with a reduced number of bit errors. Error correction capability resulting from using a number of SED parity bits may exceed an error correction capability provided by the same number of ECC parity bits.

DETAILED DESCRIPTION

Figure 1:
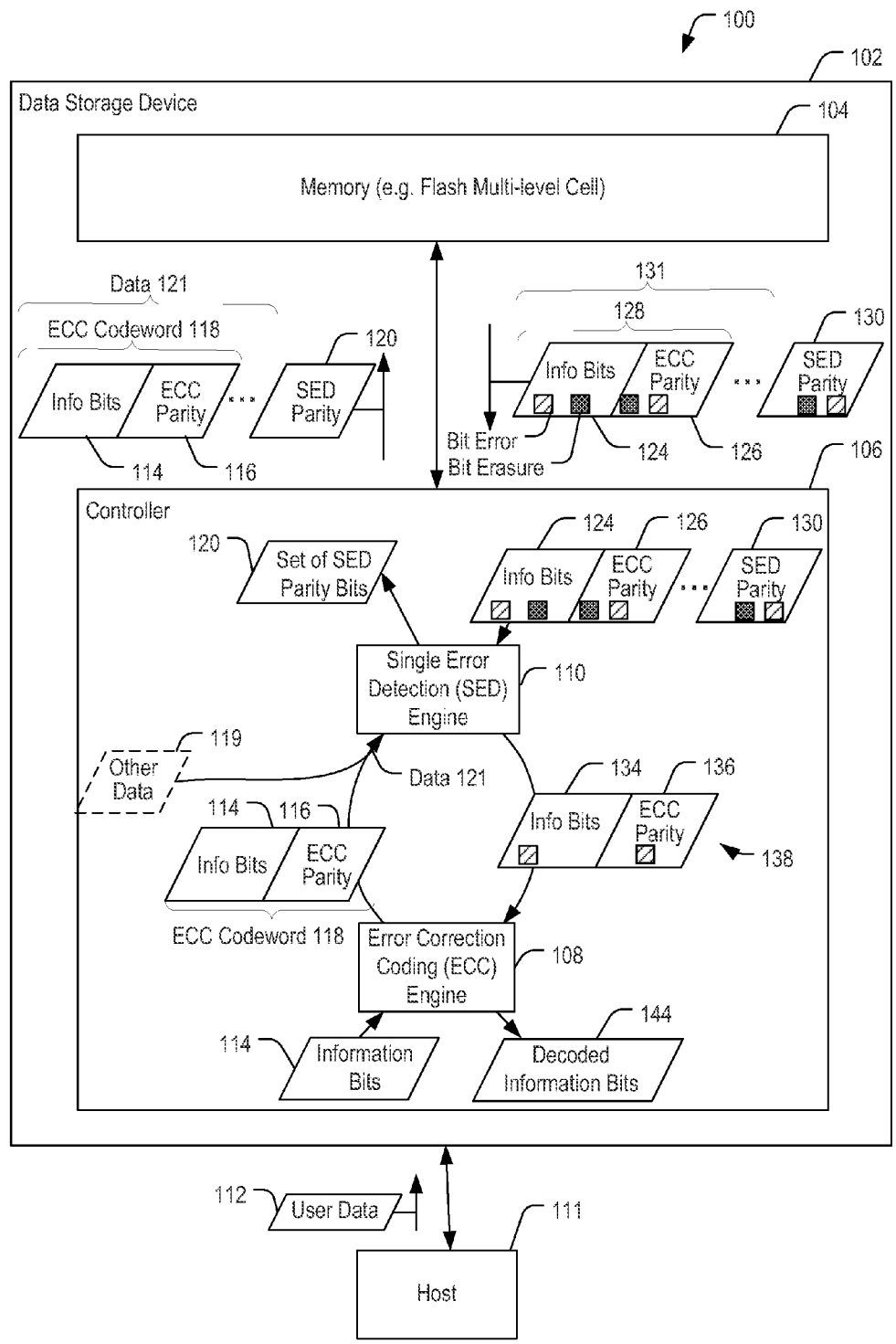
FIG. 1 is a block diagram of a particular illustrative embodiment of a system including a data storage device configured to correct erasures using single error detection parity.

Referring to FIG. 1, a particular embodiment of a system 100 includes a data storage device 102 coupled to a host device 111. The data storage device 102 includes a memory 104 and a controller 106. The controller 106 is configured to correct erasures in data retrieved from the memory 104 using single error detection (SED) parity.

The host device 111 may be configured to provide data, such as user data 112, to be stored at the memory 104 or to request data to be read from the memory 104. For example, the host device 111 may include a mobile telephone, a music or video player, a gaming console, an electronic book reader, a personal digital assistant (PDA), a computer, such as a laptop computer, notebook computer, or tablet, any other electronic device, or any combination thereof.

The data storage device 102 includes the memory 104 coupled to the controller 106. The memory 104 may be a non-volatile memory, such as an MLC NAND flash memory. For example, the data storage device 102 may be a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). As another example, the data storage device 102 may be configured to be coupled to the host device 111 as embedded memory, such as eMMC® (trademark of JEDEC Solid State Technology Association, Arlington, Va.) and eSD, as illustrative examples.

The controller 106 is configured to receive data and instructions from and to send data to the host device 111 while the data storage device 102 is operatively coupled to the host device 111. The controller 106 is further configured to send data and commands to the memory 104 and to receive data from the memory 104. For example, the controller 106 is configured to send data and a write command to instruct the memory 104 to store the data to a specified address. As another example, the controller 106 is configured to send a read command to read data from a specified address of the memory 104.

The controller 106 includes an error correction coding (ECC) engine 108 that is configured to receive data to be stored to the memory 104, such as information bits 114, and to generate an ECC codeword 118. For example, the ECC engine 108 may include an encoder configured to encode data using an ECC encoding scheme, such as a Reed Solomon encoder, a Bose-Chaudhuri-Hocquenghem (BCH) encoder, a low-density parity check (LDPC) encoder, a Turbo Code encoder, an encoder configured to encode according to one or more other ECC encoding schemes, or any combination thereof. The ECC engine 108 may include a decoder configured to decode data read from the memory 104 to detect and correct, up to an error correction capability of the ECC scheme, bit errors that may be present in the data.

The controller 106 includes a single error detection (SED) engine 110. The single error detection engine 110 is configured to generate a set of single error detection parity bits 120 corresponding to data 121 that is received at an input of the single error detection engine 110. The data 121 includes the ECC codeword 118 including the information bits 114 and the ECC parity bits 116 of the ECC codeword 118. In some implementations, the data 121 is the ECC codeword 118 and the set of SED parity bits 120 is generated based on the ECC codeword 118. In other implementations, the data 121 also includes other data 119. For example, the other data 119 may include one or more other ECC codewords, header data, other data, or any combination thereof, that is processed with the ECC codeword 118 to generate the set of SED parity bits 120. For example, the set of SED parity bits 120 may be generated for a set of twelve ECC codewords that are to be programmed to a single word line of the memory 104. Each SED parity bit of the set of SED parity bits 120 indicates a parity value for a corresponding portion of the data 121, as described in further detail with respect to FIG. 2. Each SED parity bit enables the controller 106 to determine whether an odd number of errors has occurred in a particular portion of a representation 131 of the data 121 read from the memory 104. However, the SED parity bits themselves do not provide error location information that indicates which bit(s) of the corresponding portion of the data 121 may be in error.

During operation, the controller 106 may provide the information bits 114 to the ECC engine 108 to generate the ECC codeword 118. The information bits 114 may correspond to the user data 112 received from the host device 111 while the host device 111 is operatively coupled to the data storage device 102. The data 121 including the ECC codeword 118 is received by the single error detection engine 110, and the single error detection engine 110 generates the set of SED parity bits 120, as described in further detail with respect to FIG. 2. The controller 106 is configured to provide the data 121 (including ECC codeword 118 and optionally including the other data 119) and the set of SED parity bits 120 to be stored in the memory 104.

The controller 106 may retrieve a representation 131 of the data 121 and a representation 130 of the set of SED parity bits 120 from the memory 104. The representation 131 of the data 121 includes a representation 128 of the ECC codeword 118. The representation 128 of the ECC codeword 118 includes a representation 124 of the information bits 114 and a representation 126 of the ECC parity bits 116. The representation 131 of the data 121 may correspond to the data 121 with one or more bit errors. For example, the representation 128 of the ECC codeword 118 may correspond to the ECC codeword 118 with one or more bit errors in the information bits 114, in the ECC parity bits 116, or both. The representation 130 of the set of SED parity bits 120 may correspond to the set of SED parity bits 120 with one or more bit errors.

To illustrate, the controller 106 may instruct the memory 104 to perform a soft read operation to provide information indicating whether a bit erasure has occurred at any particular location of the representation 131 of the data 121 and the representation 130 of the set of SED parity bits 130. For example, as described in further detail with respect to FIG. 4, a first read may be performed of a word line of the memory 104 using a first set of threshold voltages to determine a first set of bit values to be read from the word line. A second read may be performed of the same word line using an offset set of threshold voltages in a voltage range in a border between states of storage elements of the memory 104. A read value of a storage element having a first bit value using a first set of threshold voltages but having a second bit value using the offset set of threshold voltages may be considered an erasure. Data including hard bit information and erasure information may be sent from the memory 104 to the controller 106.

The controller 106 provides the data retrieved from the memory 104 to the single error detection engine 110 to perform a single error detection operation using the representation 130 of the set of SED parity bits 120. As described in further detail with respect to FIG. 3, the single error detection engine 110 may be configured to determine whether any portion of the data 121 that corresponds to a single one of the SED parity bits has a single detected erasure. In response to a portion of the representation 131 of the data 131 having a single erasure and the corresponding SED parity bit indicating a bit error in the portion, the single error detection engine 110 may change a bit value at the erasure location. The single error detection engine 110 may output an updated representation of the data 121, such as an updated representation 138 of the ECC codeword 118, including an updated representation 134 of the information bits 114 and an updated representation 136 of the ECC parity bits 116, with one or more hard bits corresponding to erasures having updated values.

As illustrated, the updated representation 138 of the ECC codeword 118 may contain one or more bit errors. However, one or more erasures may have been resolved by operation of the SED engine 110, as described in further detail with respect to FIG. 3. The updated representation 138 of the ECC codeword 118 generated by the SED engine 110 is provided to the ECC engine 108. The controller 106 is configured to initiate an ECC decode operation of the updated representation 138 of the ECC codeword 118 at the ECC engine 108 to generate decoded information bits 144. The decoded information bits 144 correspond to the information bits 114 originally encoded to be stored at the memory 104.

By operation of the single error detection engine 110 to resolve one or more erasures appearing in the representation 131 of the data 121 including the ECC codeword 118, the updated representation 138 of the ECC codeword 118 may be provided having fewer bit errors than originally present in the representation 128 of the ECC codeword 118. As a result, a less powerful ECC engine 108 may be used to provide a same net error correction capability as a more powerful ECC engine because the less powerful ECC engine 108 has a statistically fewer number of errors to decode in each received codeword.

Alternatively, or in addition, a useful life of the data storage device 102 may be extended by having a larger effective error correction capability as a result of correcting certain errors prior to data being received at the ECC engine 108. To illustrate, an error correction capability of the ECC engine 108 may be exceeded by a number of errors in the representation 128 of the ECC codeword 118 originally read from the memory 104. By operation of the single error detection engine 110, one or more errors may be corrected so that a number of remaining errors falls within an error correction capability of the ECC engine 108. Because a useful life of the data storage device 102 may be limited by a largest number of errors that may be successfully decoded by the ECC engine 108 and because error rates tend to increase with device age, data correction by the single error detection engine 110 may extend a useful life of the data storage device 102.

Figure 2:
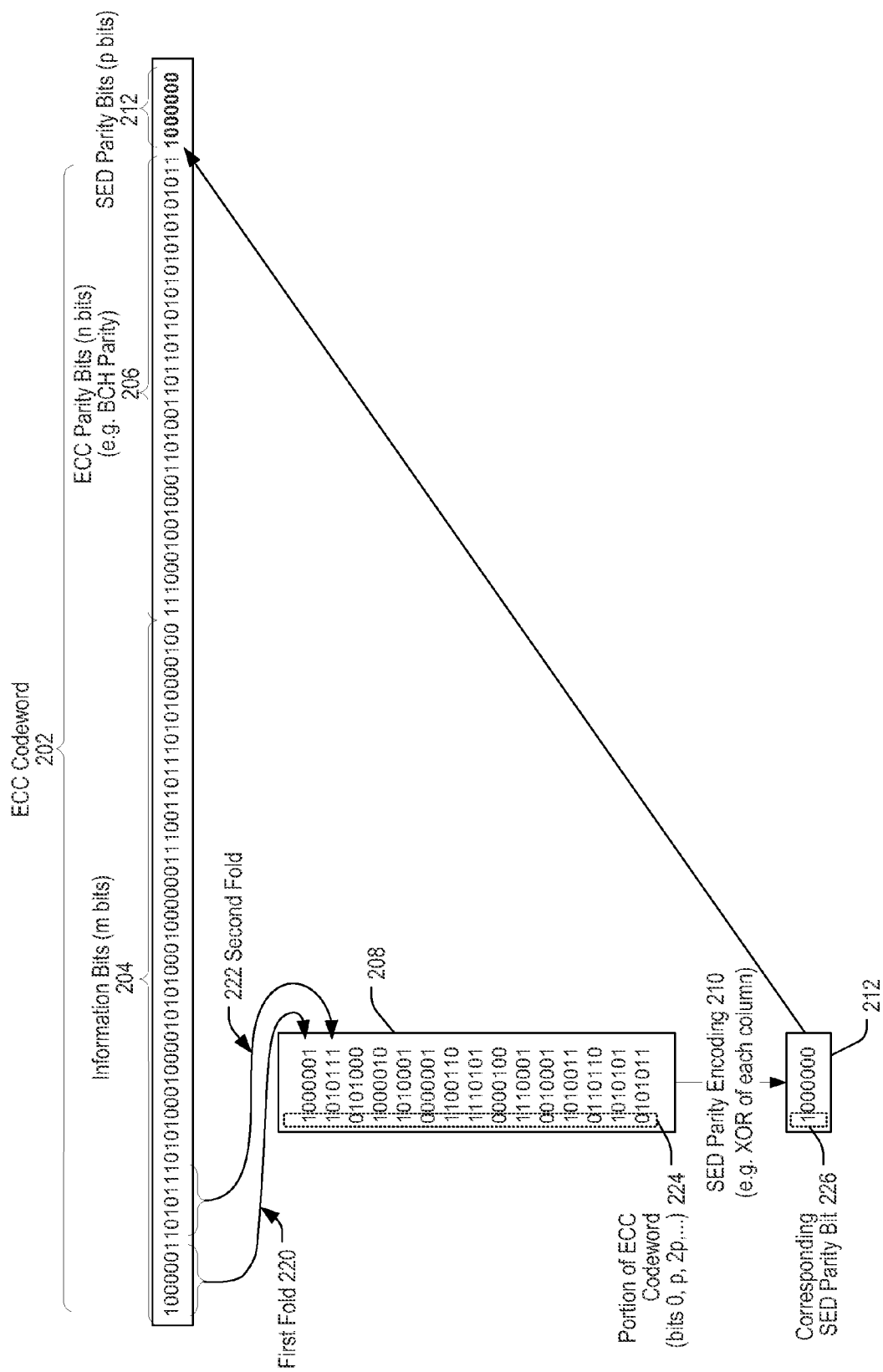
FIG. 2 is a diagram illustrating a particular embodiment of single error detection parity encoding that may be used by the data storage device of FIG. 1.

FIG. 2 depicts a particular embodiment of single error detection parity encoding that may be performed by the data storage device of FIG. 1. An ECC codeword 202 includes a set of information bits 204 and a set of ECC parity bits 206. A set of SED parity bits 212 correspond to the ECC codeword 202. For example, the information bits 204 may include a first number of bits, the ECC parity bits 206 may include a second number of bits, and the SED parity bits 212 may include a third number of bits. As used herein, "m" refers to the number of information bits in the set of information bits 204, "n" refers to the number of ECC parity bits in the set of ECC parity bits 206, and "p" refers to the number of SED parity bits in the set of SED parity bits 212. As an illustrative example, the ECC codeword 202 may correspond to the ECC codeword 118 of FIG. 1 and the set of SED parity bits 212 may correspond to the set of SED parity bits 120 of FIG. 1. Although FIG. 2 illustrates computing SED parity bits for a single ECC page (i.e. the single ECC codeword 202) for clarity of explanation, in other implementations the SED parity may be computed for a word line or a set of word lines, where each word line may contain more than one ECC page.

The ECC codeword 202 may be processed by the single error detection engine 110 of FIG. 1 to be encoded according to a series of "folds" of the ECC codeword 202 to generate a vertical parity structure 208. For example, a first set of p contiguous bits of the ECC codeword 202 form a first fold 220 and a next set of p contiguous bits form a second fold 222 (i.e. each fold includes a same number of bits "p" as the set of SED parity bits 212). Each fold forms a row of the vertical parity structure 208.

Each column of the vertical parity structure 208 corresponds to a portion of the ECC codeword 202 that is encoded via an SED parity encoding 210 to generate the set of SED parity bits 212. For example, a representative portion 224 of the ECC codeword 202 corresponds to a first column of the vertical parity structure 208. The portion 224 is formed from the first bit of each row of the vertical parity structure 208 and includes bits of the ECC codeword at indices 0, p, 2p, etc, where "p" indicates the number of bits in the set of SED parity bits 212.

The SED parity encoding 210 may be performed by applying an exclusive-OR (XOR) to all bits of a column of the vertical parity structure 208 to generate a corresponding SED parity bit for the column, such as a representative SED parity bit 226 corresponding to the portion 224 of the ECC codeword 202. In this manner, one SED parity bit may be generated for each column of the vertical parity structure 208. The resulting SED parity bits 212 may be appended to the ECC codeword 202 for storage at the memory 104 of FIG. 1.

Although for clarity of explanation SED encoding is illustrated as generating the vertical parity structure 208 of bits of the ECC codeword 202 and processing each column by a XOR operation to generate a single corresponding SED parity bit for each column, it will be appreciated the SED parity bits 212 may be generated without forming the vertical parity structure 208 (or any other geometric arrangement). For example, a processor or dedicated circuitry may be configured to generate the SED parity bits 212, such as by traversing the ECC codeword 202 and performing XOR computations on-the-fly or by directly accessing multiple bits of each portion in parallel via one or more multiple-input XOR logic circuits, as illustrative, non-limiting examples.

Figure 3:
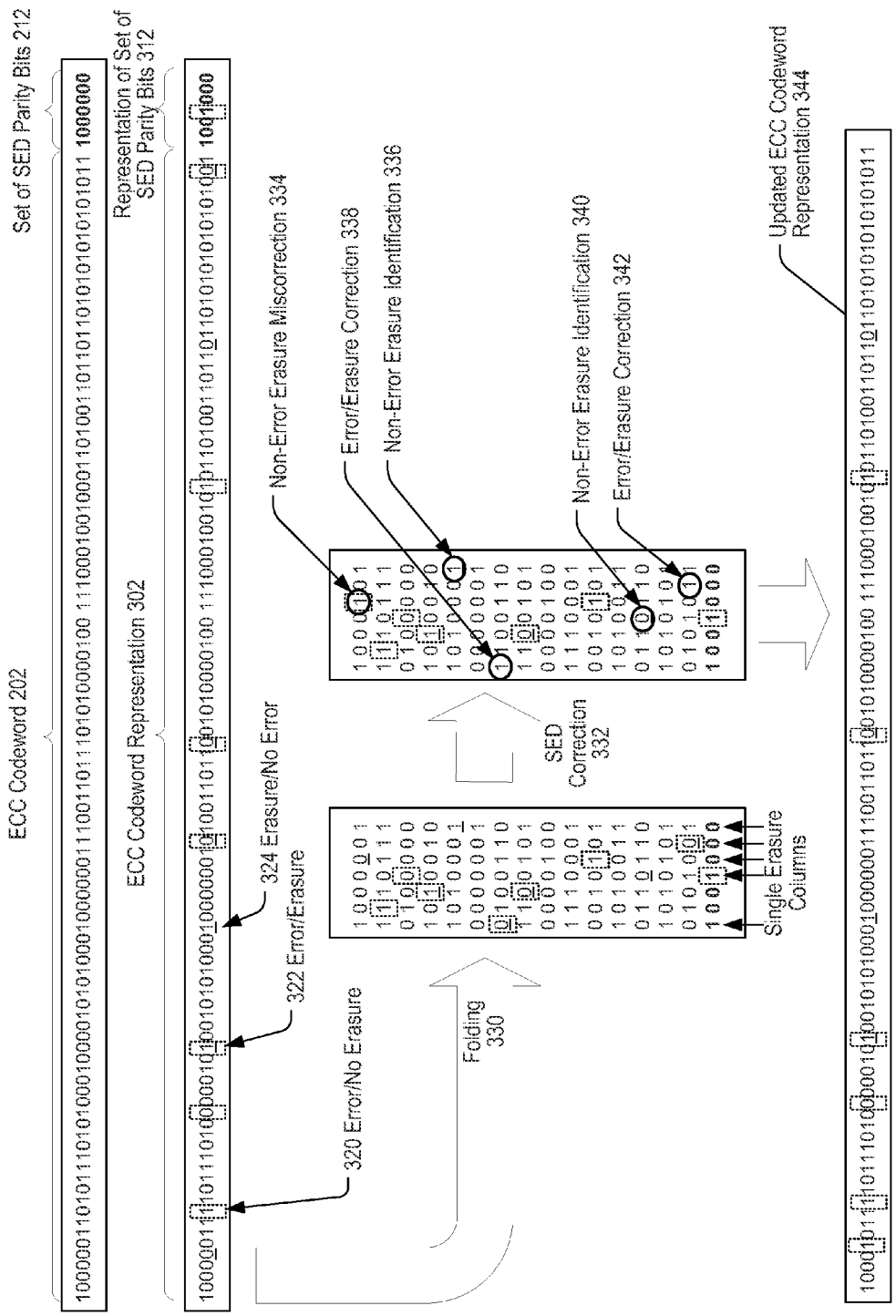
FIG. 3 is a diagram illustrating a particular embodiment of erasure correction using the single error detection parity encoding of FIG. 2.

FIG. 3 depicts a particular embodiment of erasure correction using the single error detection parity encoding of FIG. 2. The ECC codeword 202 and the set of SED parity bits 212 of FIG. 2 are illustrated as a reference to demonstrate bit errors and erasures occurring in a representation 302 of the ECC codeword 202 and a representation 312 of the set of SED parity bits 212.

Bit errors in the representation 302 of the ECC codeword 202 and in the representation 312 of the set of SED parity bits 212 are illustrated as bits having different bit values than corresponding bits in the ECC codeword 202 and the set of SED parity bits 212 and are indicated by dotted rectangles. Erasures in the representation 302 of the ECC codeword 202 and in the representation 312 of the set of SED parity bits 212, such as soft errors detected via a soft read operation, are indicated by underlining. Errors may occur that are not also erasures, such as a representative Error/No Erasure bit 320. Errors may occur that are also erasures, such as a representative Error/Erasure bit 322. Erasures may occur that are not errors, such as a representative Erasure/No Error bit 324. Although a soft read operation may identify locations of erasure bits, the soft read operation may not be able to identify whether any of the erasure bits are errors or non-errors.

Erasure resolution may be performed using the representation 312 of the set of SED parity bits 212, such as by the single error detection engine 110 of FIG. 1. A vertical parity structure may be generated from the bits of the representation 302 of the ECC codeword 202 via a folding operation 330 in a manner as described with respect to the vertical parity structure 208 of FIG. 2. Each column that contains a single erasure bit is indicated via an arrow.

An SEP correction operation 332 may be performed on each column that has a single erasure bit. A SEP parity check corresponding to a XOR of all bits in a column indicates whether an odd number of errors has occurred in the column (including in the SEP parity bit itself). An indication of an odd number of errors may be treated as an indication of a single error because a single error occurrence may be more likely than a 3-error, 5-error, or higher-error occurrence. The SEP correction operation 332 may respond to a column having a single erasure bit and a SEP parity error by changing the bit value of the erasure bit. Similarly, a zero error occurrence may be more likely than a 2-error, 4-error, or higher-error occurrence. The SEP correction 332 may respond to a column having a single erasure bit and without a SEP parity error by maintaining the bit value of the erasure bit.

A first column of the vertical parity structure shows a parity error and has a single erasure bit that is a bit error. The SEP correction operation 332 changes the bit value of the erasure bit, correcting a bit error and resulting in an error/erasure correction 338.

A fourth column of the vertical parity structure shows no parity errors (or an even number of parity errors) and has a single (non-error) erasure bit, without any bit errors in the column. The SEP correction operation 332 maintains (i.e. does not change) the bit value of the erasure bit, resulting in a non-error erasure identification 340.

A fifth column of the vertical parity structure shows a parity error and a single (non-error) erasure bit, and also has a bit error. The SEP correction operation 332 interprets the single erasure bit as the source of the parity error and changes the bit value of the erasure bit, introducing an additional bit error as a non-error erasure miscorrection 334.

A sixth column of the vertical parity structure shows a parity error and has a single erasure bit that is a bit error. The SEP correction operation 332 changes the bit value of the erasure bit, correcting the bit error and resulting in an error/erasure correction 342.

A seventh column of the vertical parity structure shows no parity errors (or an even number of parity errors) and has a single (non-error) erasure bit, without any bit errors in the column. The SEP correction operation 332 maintains the bit value of the erasure bit, resulting in a non-error erasure identification 336.

An updated ECC codeword representation 344 results from operation of the SED correction operation 332. Because the SED correction operation 332 corrects two error/erasures (error/erasure corrections 338 and 342) but miscorrects a non-error erasure (non-error miscorrection 334), the updated ECC codeword representation has one less bit error than the representation 302 of the ECC codeword 202. In an illustrative example, the updated ECC codeword representation 344 may be provided to an ECC decoder, such as the updated representation 138 of the ECC codeword 118 that is provided to the ECC engine 108 of FIG. 1.

Because under certain circumstances some non-error erasures may be miscorrected, introducing additional errors, performance of a vertical parity system such as depicted in FIGS. 2-3 may be affected by an error-to-erasure conversion rate (i.e. a percentage of errors occurring in the data that are identified as erasures). As the error-to-erasure conversion rate increases, an efficiency of a vertical parity system also increases. In addition, performance may also be affected by the fraction of error/erasure bits to total erasure bits. To illustrate, a correction efficiency of a vertical parity system increases as a likelihood that erasures correspond to errors (rather than to non-errors) increases.

Correction efficiency of a vertical parity system such as depicted in FIGS. 2-3 may be expressed via comparison to a correction capability of an ECC scheme. For example, a BCH scheme may provide approximately one bit of error correction capability for every seven ECC parity bits. A gain in correction capability resulting from using SED parity bits in place of ECC parity bits may be expressed as $$\text{gain} = (c-d) - (p/M),$$

where c is a number of bits that are corrected using the vertical parity system (e.g. the error/erasure correction 338), d is a number of bits that are miscorrected using the vertical parity system (e.g. the non-error erasure miscorrection 334), p is the number of SED parity bits (e.g. 7 bits in the set of SED parity bits 212), and M is a number of ECC parity bits that correct a single bit error using an ECC scheme (e.g. for a BCH scheme that provides one bit of error correction capability for every seven ECC parity bits, M equals 7).

As p becomes larger, c increases and d decreases. For example, increasing p causes the vertical parity structure 208 of FIG. 2 to have more bits in each row and fewer bits in each column. As a result, a likelihood of multiple errors or multiple erasures occurring in a single column decreases, increasing the effectiveness of the SED parity bit for each column. To illustrate, reducing a number of columns that have multiple erasures increases c, and reducing a number of columns that have a single erasure and multiple errors decreases d. However, an incremental increase in error correction capability resulting from an incremental increase in p reduces with increasing p.

A value of p that substantially maximizes the gain in correction capability provided by the vertical parity scheme may be determined according to:

$$\frac{d}{dp}c - \frac{d}{dp}d - \frac{1}{M} = 0$$

Alternatively, a value of p that substantially maximizes the gain in correction capability provided by the vertical parity scheme may be approximated via a Monte Carlo-type simulation. For example, p may represent a number of baskets and a value "I" (equaling a number of errors in data+a number of erasures in the data) may represent balls that are randomly tossed into the baskets. Simulations corresponding to data having a fraction of errors converted into erasures ("X") equal to 0.5 and a fraction of total errors that are error-erasures ("Y") equal to 0.5 indicate that a ratio of approximately 1.6 balls to baskets may provide a substantially largest simulated gain in correction capability. Simulations of a word line of a flash memory that includes 12 ECC pages that are folded together, based on a soft read of each ECC page that has 49 hard errors (non-erasures), 73 error-erasures, and 73 non-error erasures, indicate that 4 folds per ECC page (48 folds per word line) provides a higher mean gain than 2 folds per ECC page and than 8 folds per ECC page.

Table 1 illustrates simulated mean gain in error correction capability for a range of values of X and Y. For each X, Y combination illustrated in Table 1, the resulting gain value has a standard deviation between 5 and 6. Gain in error correction capability is provided as compared to BCH encoding with M=15.

TABLE 1

|         | Y = 0.2 | Y = 0.3 | Y = 0.4 | Y = 0.5 |
|---------|---------|---------|---------|---------|
| X = 0.3 |         |         |         |         |
| X = 0.4 |         |         |         | -3      |
| X = 0.5 |         |         | -2      | 2.9     |
| X = 0.6 |         | -4      | 5       | 10.7    |
| X = 0.7 | -12     | 0.3     | 10      | 17      |
| X = 0.8 | -6      | 7       | 18      | 26      |
| X = 0.9 | -4      | 12      | 24      | 33      |

Table 1 illustrates that using parity bits to implement a SED/vertical parity scheme as described with respect to FIGS. 1-3 can provide significant error correction improvement as compared to using the parity bits for additional BCH parity. Error correction capability gain is more pronounced at higher values of X (i.e. a large proportion of errors are identified as erasures) and at higher values of Y (i.e. a large proportion of total erasures are errors).

Figure 4:
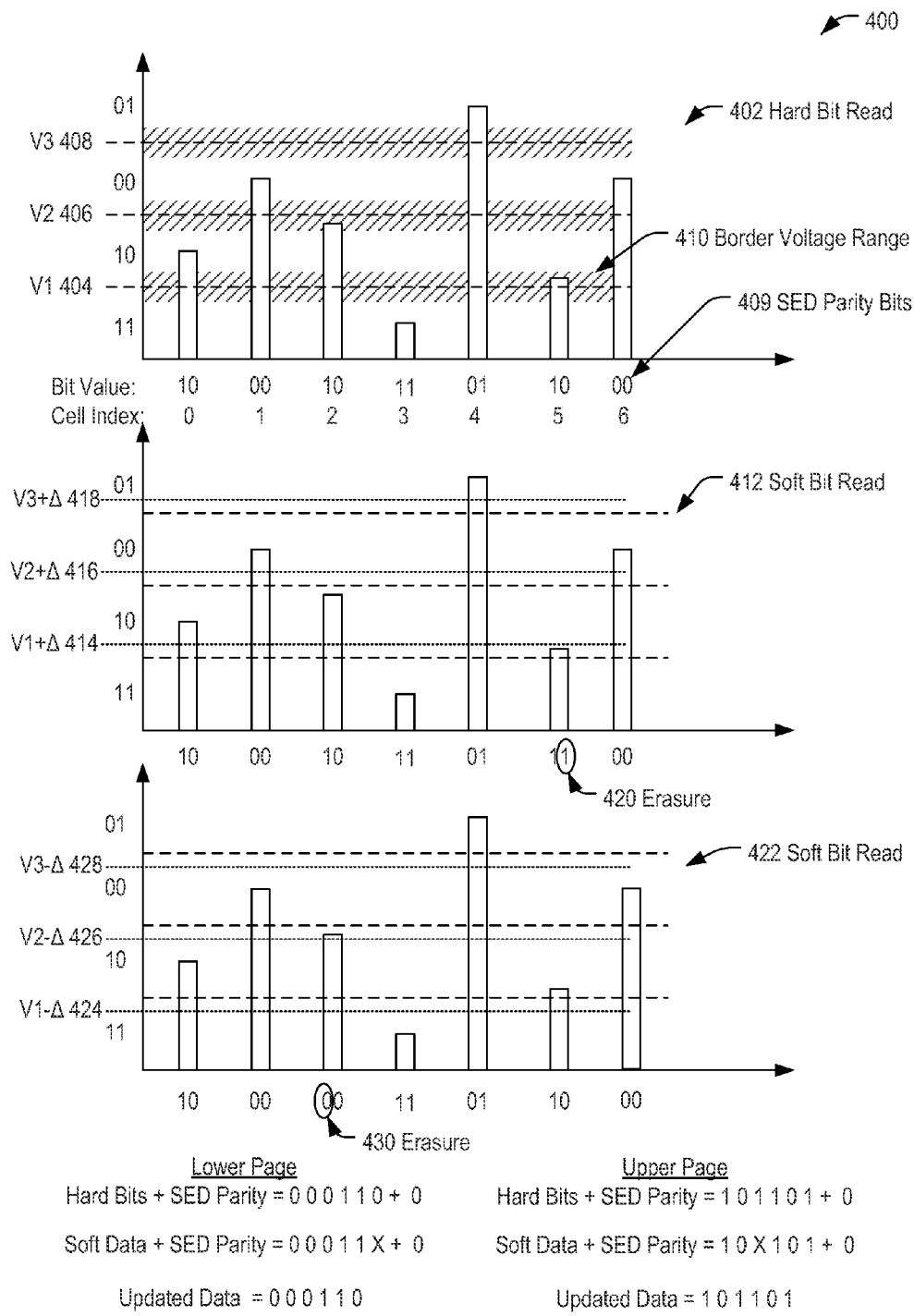
FIG. 4 is a diagram illustrating erasures in data arising from a soft read operation and erasure correction using a single error detection process.

Referring to FIG. 4, a particular embodiment of data resulting from a soft read operation and erasure correction using a single error detection process is depicted and generally designated 400. A hard bit read operation 402 is illustrated as a series of comparisons of threshold voltages of multiple MLC cells to read voltages, including a first read voltage V1 404, a second read voltage V2 406, and a third read voltage V3 408. The three read voltages 404-408 are transition voltages between states of memory cells. For example, a memory cell having a threshold voltage lower than V1 404 corresponds to a bit value of "1 1" being stored in the cell. Similarly, a cell having a threshold voltage greater than V1 404 and less than V2 406 is in a second state corresponding to a bit value of "1 0", a cell having a threshold voltage larger than V2 406 and less than V3 408 is in a state corresponding to a bit value of "0 0", and a cell having a threshold voltage greater than V3 408 is in a state corresponding to a bit value of "0 1".

Hard bits corresponding to each cell of a set of cells (cell 0, cell 1, . . . cell 6) are illustrated as a result of comparing a corresponding threshold voltage of each cell to the read voltages 404-408. To illustrate, cell 0 has a threshold voltage greater than V1 404 and less than V2 406 and has a corresponding bit value of "1 0", cell 2 has a bit value of "0 0", cell 3 has a bit value of "1 0", and cell 6 has a bit value of "0 0". The data stored in cell 6 may correspond to SED parity bits 409.

A soft bit read operation 412 is depicted showing a read of the same cells as the hard bit read operation 402 using a second set of reference voltages, illustrated as reference voltages V1+Δ 414, V2+Δ 416, and V3+Δ 418. As illustrated, the delta (Δ) corresponds to an offset voltage indicating a voltage difference from the hard bit thresholds 404-408. Each reference voltage 414, 416, and 418 of the soft bit read operation 412 lies within a respective border voltage range that includes the transition voltage between adjacent states of the MLC cells. For example, the voltage V1+Δ 414 lies within a border voltage range 410 that includes the transition voltage V1 404.

An erasure bit 420 is illustrated at cell 5 according to the soft bit read operation 412. The soft bit read operation 412 compares the threshold voltage of cell 5 to the reference voltage V1+Δ 414, causing cell 5 to have a soft bit value of "1 1" but a hard bit value of "1 0". Because the low-order bit of the memory cell transitions from "0" to "1" by adjusting a read voltage by the offset voltage Δ, the low order bit of cell 5 is designated as the erasure bit 420.

Another soft bit read operation 422 is illustrated showing threshold voltage comparisons to reference voltage V1−Δ 424, V2−Δ 426, and V3−Δ 428. Cell 2 is determined to have a soft bit read value of "0 0", differing from the hard bit read value of "1 0" due to the threshold voltage of cells lying within the border voltage range of V2 406. As a result, the high-order bit read from cell 2 is indicated as an erasure bit 430.

A read of the memory cells 0-6 according to the hard bit read operation 402, the soft bit read operation 412, and the soft bit read operation 422 results in a lower page of read bits (i.e. a data word formed of the least significant bits read from each memory cell) and an upper page of bits (i.e. a data word corresponding to the most significant bits read from each memory cell). The lower page includes the hard bits "0 0 0 1 1 0" and the SED parity bit "0" resulting from the hard bit read operation 402. As a result of the soft bit read operation 412, the erasure bit 420 may be included as soft data as a value indicated "X". Because a single erasure has occurred in the lower page data, a parity of the remaining bits may be compared to the SED parity bit to determine whether the erasure bit 420 was originally stored as a "0" bit or a "1" bit. As illustrated, the hard bits include two "1" values and the remaining non-erasure hard bits are all "0" values. A XOR operation of all of the non-erasure hard bits in the lower page returns a value of "0", matching the SED parity value of "0" and indicating that the erasure bit 420 corresponds to a "0" value. As a result, the updated data, such as may be generated at an output of the single error detection engine 110 of FIG. 1, may be provided as the bit string "0 0 0 1 1 0".

Similarly, the upper page includes the hard bits "1 0 1 1 0 1" and have the SED parity bit "0" resulting from the hard bit read operation 402. As a result of the soft bit read operation 412, the erasure bit 430 may be included in soft data as a value indicated "X". Because a single erasure has occurred in the upper page data, a parity of the remaining bits may be compared to the SED parity bit to determine whether the erasure bit 430 was originally stored as a "0" bit or a "1" bit. As illustrated, the hard bits include three "1" values and the remaining non-erasure hard bits are all "0" values. A XOR operation of the non-erasure hard bits in the upper page results in a "1" value, in contrast to the SED parity value of "0", indicating that the erasure bit 420 corresponds to a "1" value. As a result, the updated data may be provided as the bit string "1 0 1 1 0 1."

Figure 5:
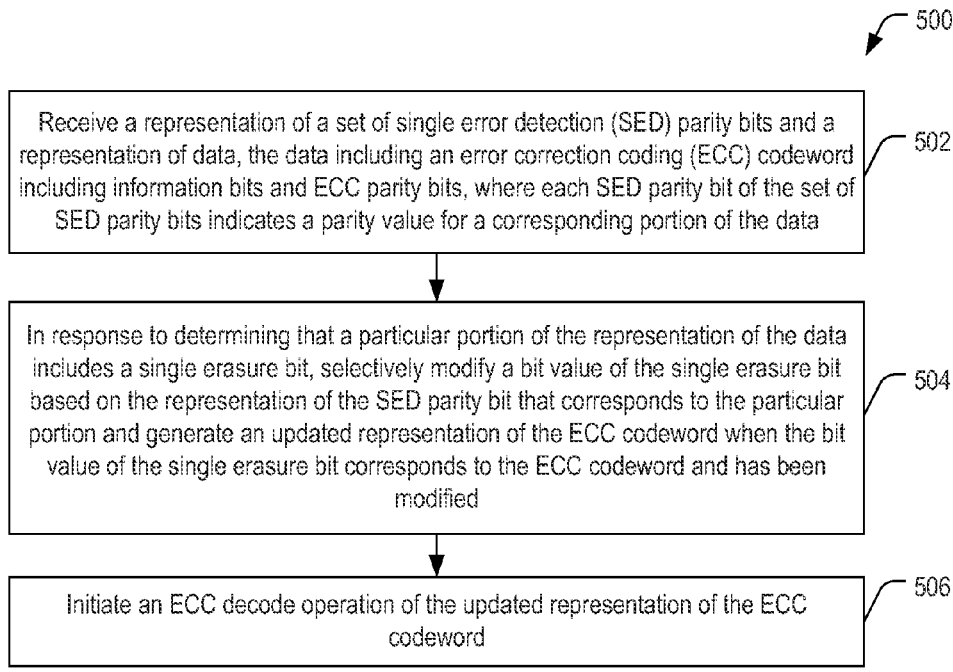
FIG. 5 is a flow chart of a particular illustrative embodiment of a method of error correction using single error detection parity.

FIG. 5 depicts a flow chart of a particular illustrative embodiment of a method 500 of error correction using single error detection parity. The method 500 may be performed in a data storage device, such as the data storage device 102 of FIG. 1.

A representation of a set of single error detection (SED) parity bits and a representation of data, the data including an error correction coding (ECC) codeword including information bits and ECC parity bits, are received, at 502. Each SED parity bit of the set of SED parity bits indicates a parity value for a corresponding portion of the data. For example, the representation of the data and the representation of the set of SED parity bits may correspond to the representation 131 of the data 121 and the representation 130 of the set of SED parity bits 120, respectively, of FIG. 1. The data storage device may include a flash memory coupled to a controller, such as the controller 106 of FIG. 1, and the representation data may be read from the flash memory and provided to the controller, such as the representation 131 of the data 121 including the ECC codeword 118 of FIG. 1.

The representation of the data and the representation of the set of SED parity bits may be received via a soft read operation that includes comparing threshold voltages of memory elements in a memory of the data storage device to at least a first reference voltage and a second reference voltage, such as V1 404 and V1+Δ 414 of FIG. 4. The first reference voltage and the second reference voltage are within a border voltage range that includes a transition voltage between adjacent states of the memory elements, such as the border voltage range 410 of FIG. 4 that includes the transition voltage V1 404 between the states "1 1" and "1 0". A memory element having a threshold value greater than the first reference voltage and less than the second reference voltage corresponds to an erasure bit, such the erasure bit 420 of FIG. 4.

In response to determining that a particular portion of the representation of the data includes a single erasure bit, a bit value of the single erasure bit is selectively modified based on the representation of the SED parity bit that corresponds to the particular portion, and an updated representation of the ECC codeword is generated when the bit value of the single erasure bit corresponds to the ECC codeword and has been modified, at 504. For example, the particular portion of the representation of the data may correspond to the first column of the vertical parity structure of FIG. 3 that has a single erasure bit. A bit value of the single erasure bit may be changed in response to a parity check indicating a bit error corresponding to the particular portion. The parity check may include performing an exclusive-OR operation on all bits in the representation of the particular portion. To illustrate, a parity check performed on the first column of the vertical parity structure of FIG. 3 indicates a parity error and the single erasure bit is changed, resulting in the error/erasure correction 338 of FIG. 3.

An ECC decode operation of the updated representation of the ECC codeword is initiated, at 506. For example, the updated representation 138 of the ECC codeword 118 may be provided to an input of the ECC engine 108 of FIG. 1 and a control signal may be generated to cause the ECC engine 108 to decode the data at the input and to generate the decoded information bits 144.

Using the set of SED parity bits to correct error/erasures in an ECC codeword retrieved from a memory reduces a number of errors remaining to be corrected during ECC decoding of the ECC codeword. An effective error correction capability may increase as a result of reduced errors in the data decoded by the ECC engine. As a result, a useful life of the memory may be increased.

Figure 6:
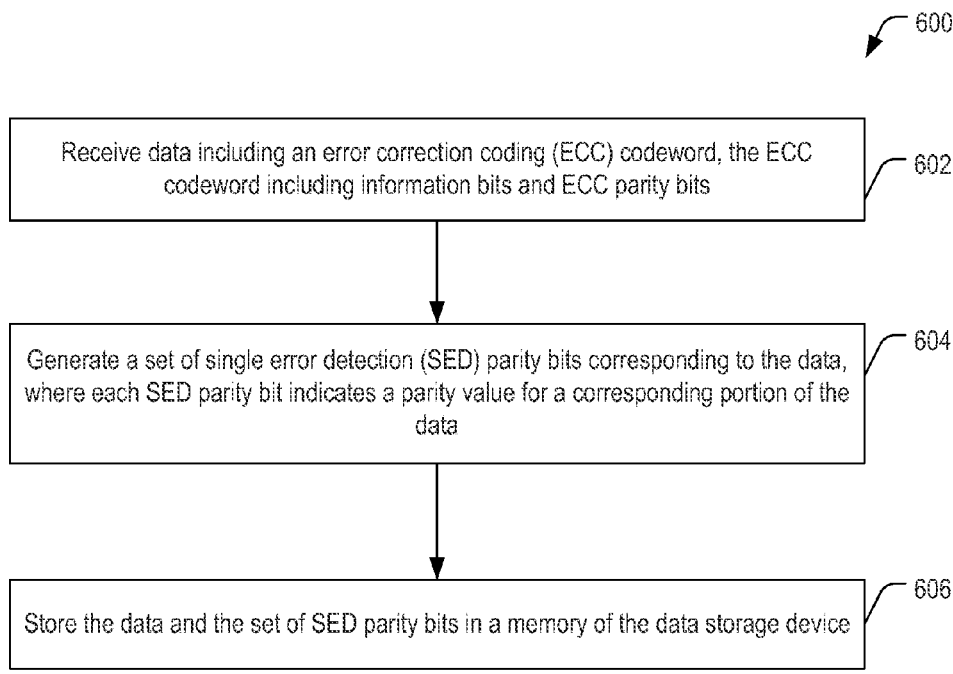
FIG. 6 is a flow chart of a particular illustrative embodiment of a method of encoding data for error correction using single error detection parity.

FIG. 6 depicts a particular illustrative embodiment of a method 600 of encoding data for error correction using single error detection parity. The method 600 may be performed in a data storage device, such as the data storage device 102 of FIG. 1. Data is received that includes an error correction coding (ECC) codeword, the ECC codeword including information bits and ECC parity bits, at 602. For example, an ECC encoding operation may be initiated at an ECC engine of the data storage device 102, such as the ECC engine 108 of FIG. 1, to generate the ECC codeword 118 that is provided as the data 121 (optionally in combination with the other data 119) to the single error detection engine 110.

A set of single error detection (SED) parity bits corresponding to the data is generated, at 604. Each SED parity bit indicates a parity value for a corresponding portion of the data. For example, the set of SED parity bits may correspond to the set of SED parity bits 120 of FIG. 1. The set of SED parity bits may be generated at a single error detection engine of a data storage device, such as the single error detection engine 110 of the data storage device 102 of FIG. 1.

Each SED parity bit may be generated according to an exclusive-OR (XOR) operation performed on all bits of the corresponding portion of the data, such as an XOR operation performed on all bits of the portion 224 of the data of FIG. 2 to generate the corresponding SED parity bit 226. For example, in an implementation where the data includes a single ECC page, the XOR operation can be applied across the single ECC page. In another implementation where the data includes multiple ECC pages (e.g. the folding illustrated in FIG. 2 is applied to a word line or multiple word lines), the XOR operation can be applied across multiple ECC pages. The set of SED parity bits may include a number of bits, the number of bits designated as "p", such as the set of SED parity bits 212 of FIG. 2. Each portion of the data includes bits in the one or more ECC codewords in the data selected according to a p bit interval, where p is the number of bits in the set of SED parity bits. To illustrate, the portion 224 of the ECC codeword 202 includes bits 0, p, 2p, etc. of the ECC codeword 202, graphically illustrated as a first column of bits of the vertical parity structure 208 generated according to a p-bit folding of the ECC codeword 202.

The data and the set of SED parity bits are stored in a memory of the data storage device, at 606. For example, the information bits 114 and the ECC parity bits 116 of the ECC codeword 118 (and in some implementations the other data 119) and the set of SED parity bits 120 are stored in the memory 104 of FIG. 1.

Generating the set of SED parity bits and storing the set of SED parity bits in the memory enables correction of some error/erasure bits prior to performing ECC decoding of the ECC codeword. An effective error correction capability may increase as a result of reduced errors in the data decoded by the ECC engine. As a result, a useful life of the memory may be increased.

Although various components depicted herein are illustrated as block components and described in general terms, such components may include one or more microprocessors, state machines, or other circuits configured to enable the SED engine 110 of FIG. 1 to generate sets of SED parity bits and to use the SED parity bits to correct erasure bits read from the memory 104. For example, the SED engine 110 may represent physical components, such as hardware controllers, state machines, logic circuits, or other structures, to enable the SED engine 110 of FIG. 1 to partition a representation of data including a representation of an ECC codeword into multiple portions, identify one or more portions containing a single erasure, perform a parity check using a corresponding representation of an SED parity bit, and change a value of the erasure bit based on a result of the parity check.

In a particular embodiment, the data storage device 102 may be implemented in a portable device configured to be selectively coupled to one or more external devices. However, in other embodiments, the data storage device 102 may be attached or embedded within one or more host devices, such as within a housing of a host communication device. For example, the data storage device 102 may be within a packaged apparatus such as a wireless telephone, a personal digital assistant (PDA), a gaming device or console, a portable navigation device, or other device that uses internal non-volatile memory. In a particular embodiment, the data storage device 102 may be coupled to a non-volatile memory, such as a three-dimensional (3D) memory, a flash memory (e.g., NAND, NOR, Multi-Level Cell (MLC), a Divided bit-line NOR (DINOR) memory, an AND memory, a high capacitive coupling ratio (HiCR), asymmetrical contactless transistor (ACT), or other flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
   in a data storage device, performing:
   receiving a representation of a set of single error detection (SED) parity bits and a representation of data, the data including an error correction coding (ECC) codeword including information bits and ECC parity bits, wherein each SED parity bit of the set of SED parity bits indicates a parity value for a corresponding portion of the data;
   in response to determining that a particular portion of the representation of the data includes a single erasure bit, selectively modifying a bit value of the single erasure bit based on the representation of the SED parity bit that corresponds to the particular portion and generating an updated representation of the ECC codeword when the bit value of the single erasure bit corresponds to the ECC codeword and has been modified; and
   initiating an ECC decode operation of the updated representation of the ECC codeword.

2. The method of claim 1, wherein the representation of the data and the representation of the set of SED parity bits are received via a soft read operation that includes comparing threshold voltages of memory elements in a memory of the data storage device to at least a first reference voltage and a second reference voltage, wherein the first reference voltage and the second reference voltage are within a border voltage range that includes a transition voltage between adjacent states of the memory elements, and wherein a memory element having a threshold value greater than the first reference voltage and less than the second reference voltage corresponds to an erasure bit.

3. The method of claim 1, wherein a bit value of the single erasure bit is changed in response to a parity check indicating a bit error corresponding to the particular portion.

4. The method of claim 3, wherein the parity check includes performing an exclusive-OR operation on all bits in the representation of the particular portion.

5. The method of claim 1, wherein the data storage device includes a flash memory coupled to a controller and wherein the representation of the data is read from the flash memory and provided to the controller.

6. A data storage device comprising:
    a memory; and
    a controller configured to receive from the memory a representation of a set of single error detection (SED) parity bits and a representation of data, the data including an error correction coding (ECC) codeword including information bits and ECC parity bits, wherein each SED parity bit of the set of SED parity bits indicates a parity value for a corresponding portion of the data,
    wherein in response to determining that a particular portion of the representation of the data includes a single erasure bit, the controller is further configured to selectively modify a bit value of the single erasure bit based on the representation of the SED parity bit that corresponds to the particular portion and to generate an updated representation of the ECC codeword when the bit value of the single erasure bit corresponds to the ECC codeword and has been modified.

7. The data storage device of claim 6, further comprising an ECC engine and wherein the controller is configured to initiate an ECC decode operation of the updated representation of the ECC codeword at the ECC engine.

8. The data storage device of claim 6, further comprising a single error detection engine configured to change the bit value of the single erasure bit in response to a parity check indicating a bit error corresponding to the particular portion.

9. The data storage device of claim 8, wherein the parity check includes an exclusive-OR operation that is performed on all bits in the representation of the particular portion.

10. The data storage device of claim 6, wherein the memory includes a multi-level cell (MLC) flash memory.

11. A method comprising:
    in a data storage device, performing:
        receiving data including an error correction coding (ECC) codeword, the ECC codeword including information bits and ECC parity bits;
        generating a set of single error detection (SED) parity bits corresponding to the data, wherein each SED parity bit indicates a parity value for a corresponding portion of the data; and
        storing the data and the set of SED parity bits in a memory of the data storage device.

12. The method of claim 11, wherein each SED parity bit is generated according to an exclusive-OR operation performed on all bits of the corresponding portion of the data.

13. The method of claim 11, wherein the set of single error detection parity bits is generated at a single error detection engine of the data storage device.

14. The method of claim 11, further comprising initiating an ECC encoding operation at an ECC engine of the data storage device to generate the ECC codeword.

15. The method of claim 11, wherein the set of SED parity bits includes p bits and wherein each portion of the data includes bits in the ECC codeword selected according to a p bit interval.

16. A data storage device comprising:
    a memory; and
    a controller including a single error detection engine configured to receive data including an error correction coding (ECC) codeword, the ECC codeword including information bits and ECC parity bits, and to generate a set of single error detection (SED) parity bits corresponding to the data, wherein each SED parity bit indicates a parity value for a corresponding portion of the data,
    wherein the controller is configured to store the data and the set of SED parity bits in the memory.

17. The data storage device of claim 16, wherein each SED parity bit is generated according to an exclusive-OR operation performed on all bits of the corresponding portion of the data.

18. The data storage device of claim 16, further comprising an ECC engine configured to generate the ECC codeword.

19. The data storage device of claim 16, wherein the set of SED parity bits includes p bits and wherein each portion of the data includes bits in the ECC codeword selected according to a p bit interval.

20. The data storage device of claim 16, wherein the information bits correspond to user data received from a host device while the host device is operatively coupled to the data storage device.

21. A method of handling data, the data including first and second error correcting codewords, the method comprising:
    determining whether the data includes at least one erasure bit;
    correcting the at least one erasure bit using the first error correcting codeword upon determining that the data includes the at least one erasure bit;
    determining whether the data includes at least one errored bit using the second error correcting codeword; and
    correcting the at least one errored bit upon determining that the data includes at least one errored bit.

22. The method of claim 21, wherein determining whether the data includes the at least one erasure bit includes locating the at least one erasure bit.

23. The method of claim 22, wherein the data is in a storage device and wherein locating the at least one erasure bit includes:
    performing a first read of the data from the storage device to obtain a first set of bits representing the data;
    performing a second read of the data from the storage device to obtain a second set of bits representing the data; and
    comparing the first set of bits to the second set of bits, the at least one erasure bit being at least one bit having a value different in the second set of bits than in the first set of bits.

24. The method of claim 23, wherein the first read is a hard read and the second read is a soft read.

25. The method of claim 21, wherein the at least one erasure bit is in the first error correcting codeword.

26. The method of claim 21, wherein the at least one erasure bit is in the second error correcting codeword.

27. The method of claim 21, wherein the data further includes information data and the at least one erasure bit is in the information data.

* * * * *